United States Patent [19]

Jones, Jr.

[11] Patent Number: 4,980,752
[45] Date of Patent: Dec. 25, 1990

[54] TRANSITION METAL CLAD INTERCONNECT FOR INTEGRATED CIRCUITS

[75] Inventor: Robert E. Jones, Jr., Colorado Springs, Colo.

[73] Assignee: Inmos Corporation, Colorado Springs, Colo.

[21] Appl. No.: 947,013

[22] Filed: Dec. 29, 1986

[51] Int. Cl.$^5$ ............................................. H01L 23/48
[52] U.S. Cl. ....................................... 357/71; 357/65; 357/71; 357/71 S
[58] Field of Search ........................... 357/71, 71 S, 65

[56] References Cited

U.S. PATENT DOCUMENTS 3,672,984  6/1972  Sato et al. .............................. 357/71
4,527,184  7/1985  Fischer .................................. 357/71

FOREIGN PATENT DOCUMENTS 0110401   6/1984  European Pat. Off. .
3414781   7/1980  Fed. Rep. of Germany .
61156752  7/1986  Japan ..................................... 357/71
205230    3/1987  Japan .

OTHER PUBLICATIONS

IBM Technical Disclosure Bulletin, vol. 13, No. 5, Oct. 1970, "Silver Metallurgy for Semiconductor Device", by F. M. Pressman and A. J. Rideout.
Electronics and Optics, Thin Solid Films, 96(182), p. 327-345, "The Use of Titanium Based Contact Barrier Layers in Si Technology".
Materials Letters, vol. 4, No. 5, 6, 7, Jul. 1986, "Microstructures and Properties of AlSi-Ti Multilayer Structure", by Nahar.
IBM Technical Disclosure Bulletin, vol. 26, No. 9, Feb. 1984, pp. 4492-4493.
6046 materials Letters 4(1986), Jul., No. 5/6/7, Amsterdam, Netherlands, pp. 264-267.

Primary Examiner—Rolf Hille
Assistant Examiner—Steven Loke
Attorney, Agent, or Firm—Edward D. Manzo

[57] ABSTRACT

An integrated circuit includes a patterned aluminum based interconnect clad on the top and side portions with a layer of transition metal. The cladding of transition metal prevents the formation of both vertical hillocks and lateral protrusions. Preventing these formations increases the reliability of an interconnect by significantly reducing passivation cracking and electrical shorting between interconnects which result from vertical hillock and lateral protrusion formations.

18 Claims, 2 Drawing Sheets

TRANSITION METAL CLAD INTERCONNECT FOR INTEGRATED CIRCUITS

FIELD OF THE INVENTION

The present invention relates generally to integrated circuit fabrication and especially to an interconnect for use in integrated circuits having strips for connecting elements. More particularly, this invention relates to an aluminum based interconnect member having top and side portions clad with a transition metal to provide increased reliability of the interconnect for integrated circuits.

BACKGROUND OF THE INVENTION

Interconnect members for integrated circuits are known which include aluminum or aluminum based alloys layered with transition metals such as titanium. J. Howard et al., "Intermetallic Compounds of Al and Transition Metals: Effect of Electromigration in 1-2 $\mu$m Wide Lines," *J. Appl. Phys.*, Vol. 49, p. 4083 (1978); U.S. Pat. No. 4,017,890 issued Apr. 12, 1977, to Howard et al., entitled, "Intermetallic Compound Layer in Thin Films for Improved Electromigration Resistance;" U.S. Pat. No. 4,154,874 issued May 15, 1979, to Howard et al., entitled, "Method for Forming Intermetallic Layers in Thin Films for Improved Electromigration Resistance;" and S. Iyer et al., "Electromigration Study of the Al-Cu/Ti/Al-Cu System," *22nd Ann. Int'l Reliability Phys. Symp., Conf. Proc.* (Las Vegas, 1984).

Interconnects formed of aluminum and aluminum alloys, however, suffer from certain difficulties which have been associated with mass transport or diffusion of aluminum atoms. One such problem is the formation of protrusions, commonly known as hillocks, which form during high temperature processing steps, typically in the range of 200° C. to 450° C. These hillocks are formed to relieve the compressive stresses generated in the aluminum by the differential thermal expansion between the aluminum and the silicon substrate wafer. Another problem is that of electromigration failures caused by transport of atoms under the influence of an electric current. In addition, mechanical stress voids created by creep or the transport of atoms under the influence of high tensile stress also lead to interconnect failures.

Layering an interconnect member with titanium has been found to completely eliminate vertical hillocks during thermal processing steps. D. Gardner et al., "Layered and Homogeneous films of Aluminum and Aluminum/Silicon with Titanium and Tungsten for Multilevel Interconnects,"*IEEE Trans. Elect. Devices*, Vol. ED-32, p. 174 (1985). Layering with titanium has also reduced failures caused by electromigration. However, it has been found that titanium layered interconnect members often suffer passivation dielectric cracking prior to an electrical open circuit failure due to the mass transport of aluminum atoms within each separate layer of the interconnect. More specifically, aluminum protrusions from some of these cracks have been observed. This is described by R.E. Jones, Jr. and L.D. Smith, "Contact Spiking and Electromigration Passivation Cracking Observed for Titanium Layered Aluminum Metallization," *IEEE VLSI Multilevel Interconnect Conf., Conf. Proc.*, p. 192 (Santa Clara 1985). Therefore, passivation cracking can result in two reliability problems; that of electrical shorting between adjacent interconnect members resulting from the aluminum protrusions, and corrosion of the exposed metal interconnect members through the broken passivation layer. These lateral protrusions are caused by mass transport of aluminum atoms within each aluminum-silicon layer under the influence of an electric current. Various sources of nonuniformity result in mass depletion in some regions and mass accumulation in other regions. The mass accumulation can results in lateral hillocks, especially since the ability to form vertical protrusions is restricted by the titanium layer or layers. Eliminating or reducing these lateral aluminum protrusions would prevent both problems of passivation layer cracking and electrical shorting between adjacent interconnect members.

SUMMARY OF THE INVENTION

In accordance with the present invention, the disadvantages of prior interconnect members for integrated circuits, as discussed above, have been overcome. The interconnect member of the present invention incorporates a transition metal cladding that covers both the top and sides of the interconnect member.

The transition metal cladding of the present invention acts to reduce both vertical hillocks and lateral protrusions due to thermal cycling and electromigration. Elimination of the vertical hillocks and lateral protrusions increases the reliability and yields advantages beyond those available with the use of horizontal transition metal layers alone.

BRIEF DESCRIPTION OF THE DRAWINGS

These and other objects and advantages of the invention, as well as details of several illustrative embodiments, will become apparent upon reading the following detailed description with reference to the drawings. Throughout the drawings, like reference numerals refer to like parts.

DETAILED DESCRIPTION OF THE PREFERRED EMBODIMENTS

While the invention will be described in connection with several preferred embodiments, it will be understood that the descriptions are not intended to limit the invention to these embodiments or procedures. On the contrary, it is intended to cover all alternatives, modifications and equivalents as may be included within the spirit and scope of this invention as defined by the appended claims now and as they may be amended from time to time.

Figure 1A:
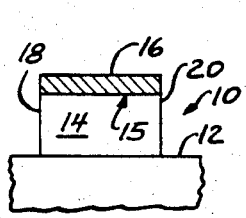
FIGS. 1(a)–1(c) illustrate the sequential construction of an exemplary clad interconnect member fabricated in accordance with the present invention.
Figure 1B:
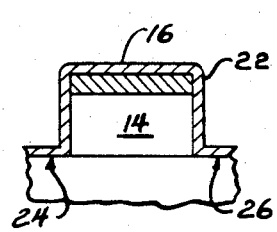
Figure 1C:
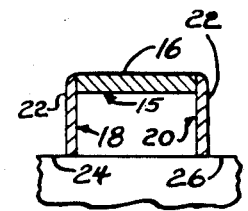

Turning first to FIGS. 1(a)–1(c) there is illustrated the sequential fabrication of a preferred embodiment of present invention. An interconnect member 10 is formed in a conventional manner on an integrated circuit surface 12. Surface 12 may be, for example, a silicon substrate, a layer of dielectric material, or a diffusion barrier which forms an integral part of the integrated circuit being manufactured and forms a base for the interconnect member being constructed. In the preferred embodiment, surface 12 is a dielectric layer with openings (not shown) formed by photolithographic etching processes to underlying circuit elements formed in the silicon substrate or in the deposited silicon or metal layers. Openings which allow electrical connection to silicon circuit elements would employ tungsten diffusion barriers deposited by a selective chemical vapor deposition process. If all contact openings in the dielectric layer openings are to metal circuit elements, then no diffusion barrier is required.

Figure 2A:
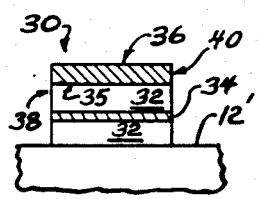
FIGS. 2(a)–2(c) illustrate the sequential construction of another embodiment of a clad interconnect member fabricated in accordance with the present invention.

Interconnect member 10 is initially formed from an aluminum based film 14 which many be aluminum, a homogeneous aluminum alloy such as aluminum-silicon (having a preferred silicon concentration between 0.5 and 2.0 weight percent), aluminum-copper, aluminum-silicon-titanium (having a preferred silicon concentration between 0.5 and 2.0 weight percent and a preferred titanium concentration between 0.1 and 0.5 weight percent) or (as shown in FIG. 2(a)) it may be a transition metal layered aluminum alloy. Whatever composition is chosen, the combined thickness of the aluminum film is between 5000 and 12,000 angstroms. In the preferred embodiment shown in FIGS. 1(a)-1(c), aluminum based film 14 is an aluminum-silicon alloy. Aluminum based film 14 is then capped on a top surface 15 with a top transition metal layer 16 which may be deposited in any conventional manner such as, for example, sputtering, chemical vapor deposition or evaporation, and is established in a layer 200 to 1000 angstroms thick. In the preferred embodiment, transition metal 16 is titanium and is established by a sputtering technique. Other transition metals such as tungsten, tantalum, niobium and molybdenum would be acceptable.

Following deposition of transition metal layer 16, aluminum film 14 and transition metal layer 16 are exposed to a photolithographic etching technique, such as a plasma or reactive ion dry etch, and are patterned into the desired interconnection pattern for the integrated circuit being fabricated. In the preferred embodiment a chlorine based dry etch is used since it etches both aluminum and titanium well. This produces the well defined sides 18 and 20 which define interconnect member 10.

As shown in FIG. 1(b), a conformal layer 22 of a transition metal such as, for example, titanium, tungsten, tantalum, niobium or molybdenum, is then deposited over patterned interconnect member 10. This transition metal can be the same as that used to create transition metal layer 16, or as shown in the preferred embodiment, it can be a different transition material, such as tungsten. Deposition of conformal layer 22 may be by any of the usual deposition techniques including sputtering, chemical vapor deposition (CVD), or evaporation. CVD deposition is the preferred technique when conformal layer 22 is tungsten.

Conformal layer 22 clads sides 18 and 20 and adds to the total thickness of transition metal on top of patterned interconnect member 10. Conformal layer 22 is established in a layer between 200 and 600 angstroms thick. In addition, conformal layer 22 also covers areas 24 and 26 adjacent to interconnect member 10. Areas 24 and 26 represent the spaces that exist between adjacent patterned interconnect members (not shown).

An anisotropic etch is then performed to remove the portions of conformal layer 22 covering areas 24 and 26. In the preferred embodiment, a fluorine based dry etch is used for an anisotropic etching of the conformal tungsten layer. This anisotropic etch will also etch at least part of the transition metal layer on top of pattern interconnect 10. However, the fluorine based dry etch stops on the initial top transition metal layer 16 since in the present preferred embodiment layer 16 is titanium and fluorine does not etch titanium very well.

Completion of the etch leaves interconnect level 10 covered on top 15 and sides 18 and 20 with a cladding of transition metal (FIG. 1(c)).

Following the anisotropic etch, the remainder of the wafer processing proceeds as desired but includes one or more moderate (300°-450° C.) temperature processing steps such as a hydrogen ambient anneal and/or chemical vapor deposition of a passivation layer (not shown).

The transition metal cladding (16 and 22) of the present invention covering top 15 and sides 18 and 20 of interconnect member 10 prevents the formation of lateral protrusions and vertical hillocks and the resulting passivation cracking and concomitant electrical shorting and corrosion that results from such protrusions and hillocks.

Figure 2B:
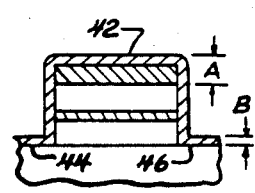

Turning now to FIG. 2(a) there is shown another embodiment according to the present invention which is formed according to the process as described with reference to FIGS. 1(a)-1(c) *supra*. In this embodiment, an interconnect member 30 is formed of layers of aluminum alloy 32 alternated with layers of a transition metal 34. Generally, according to the present inventing, interconnect member 30 comprises two to ten layers of alloy layers 32 and one to ten layers of transition metal layers 34 and has a total combined thickness of 5,000 to 12,000 angstroms. Interconnect member 30 is formed on surface 12' which in the preferred embodiment illustrated is a dielectric layer on a silicon wafer. The dielectric layer may have openings to metal circuit elements or silicon circuit elements with tungsten diffusion barriers as described above. As in FIG. 1(a), interconnect member 30 is capped on a top surface 35 with a transition metal layer 36 that is between 200 and 1000 angstroms thick. Layer 36 may or may not be the same as transition metal 34. In the preferred embodiment shown, however, transition metal layers 34 and 36 are both titanium. They could also be tungsten, tantalum, niobium or molybdenum. Interconnect member 30 is then etched to establish well defined sides 38 and 40, and is covered with a sputter deposited conformal layer 42 of titanium having a thickness between 200 and 600 angstroms. Other transition metals also could be used for conformal layer 42. Conformal layer 42 covers top 35 and sides 38 and 40 as well as adjacent areas 44 and 46 as shown in FIG. 2(b). However, the sum of transition metal 36 and conformal layer 42 (shown as distance A in FIG. 2(b)) produces a substantially thicker transition metal layer on top 35 of interconnect 30 than the layer of transition metal formed on areas 44 and 46 (shown as distance B in FIG. 2(b)).

An anisotropic dry etch is then performed to remove the transition metal from areas 44 and 46. The etch chemistry selected is dependent on the transition metal used for conformal layer 42. In the embodiment illustrated, a chlorine based dry etch is used since it etches titanium well. This anisotropic etch also etches at least part of the transition metal layer on top 35 of interconnect level 30. However, due to the increased thickness of the transition metal layer on top surface 35, interconnect member 30 will remain covered with transition metal layer 36 when the anisotropic etch has completed the removal of transition metal from areas 44 and 46. This process yields an interconnect member 30 having a cladding of transition metal on top 35 and sides 38 and 40 to prevent the formation of both vertical hillocks and lateral protrusions.

Figure 3A:
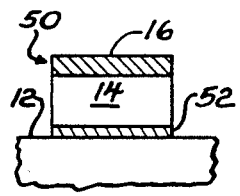
FIGS. 3(a)–3(c) illustrate the sequential construction of yet another exemplary clad interconnect member incorporating a diffusion barrier between the interconnect member and a substrate material.
Figure 3B:
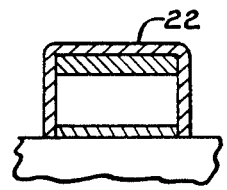
Figure 3C:
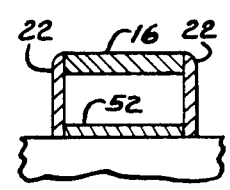
Figure 4A:
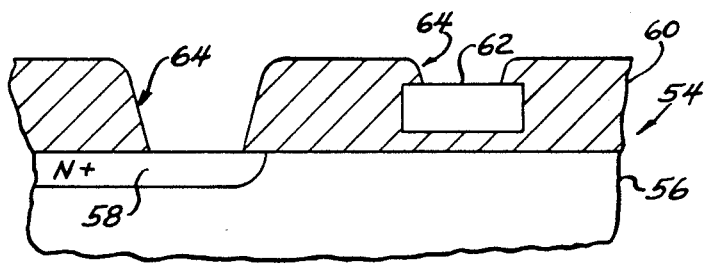
FIGS. 4(a) and 4(b) illustrate in cross-section the formation of the interconnect member of FIG. 3(a) joining circuit elements formed in and on a substrate.
Figure 4B:
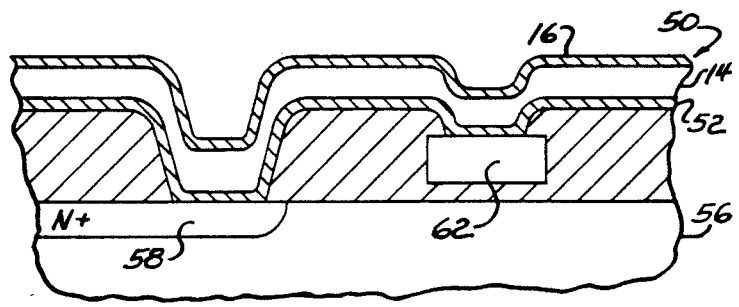

FIGS. 3(a)-3(c) show another embodiment according to the present invention. An interconnect member 50 is constructed in the same manner as described with reference to FIG. 1(a)-1(c) supra. Interconnect member 50 is the same as interconnect 10 but with the addition of a diffusion barrier 52. Diffusion barrier 52 is deposited on surface 12'' prior to deposition of aluminum-silicon alloy film 14 in order to provide a barrier between aluminum-silicon alloy film 14 and surface 12'' which illustratively is a dielectric layer with contact openings to silicon substrate and deposited silicon circuit elements as shown in FIG. 4. Following deposition of aluminum-silicon alloy 14 and transition metal layer 16, all three layers 16, 14 and 52 are patterned together to form interconnect member 50. Diffusion barrier 52 may be any conventional material sufficient to prevent a metallurgic reaction between aluminum-silicon alloy film 14 and the silicon contacts explained below in reference to FIGS. 4(a) and 4(b). Preferably, diffusion barrier 52 is a relatively thin layer of titanium nitride approximately 300 to 700 angstroms thick. Other materials such as, for example, refractory metals (Ti, W), and refractor metal alloys (Ti-W), may also be used as diffusion barriers. Processing of interconnect member 50 proceeds in the manner described with reference to FIGS. 1(a)-1(c) to produce an interconnect member having a layer of titanium on the top and tungsten on the side portions to prevent both vertical hillock and lateral protrusion formation.

Turning now to FIGS. 4(a) and 4(b), there is illustrated an example of the interconnect according to the present invention used to join circuit elements on a semiconductor wafer 54. FIG. 4(a) shows wafer 54 on which an interconnect member like that illustrated in FIG. 3(a) will be fabricated. Wafer 54 includes a silicon substrate 56 with circuit elements formed therein represented illustratively by an N+ region 58. Additionally, wafer 54 includes a dielectric film 60 and a polycrystalline silicon film 62 which are grown or deposited on silicon substrate 56 and patterned into various structures as dictated by the process and circuit design. Photolithography and etching techniques are used to form contact openings 64 to expose circuit elements formed in and on substrate 56.

Figure 2C:
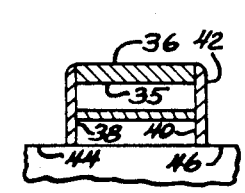

As shown in FIG. 4(b), an interconnect member is then formed joining circuit element 58 to polycrystalline silicon 62. While any of the embodiments illustrated in FIGS. 1-3 could be used, the preferred embodiment is that of interconnect member 50 illustrated in FIG. 3(a). Interconnect member 50 is spaced from semiconductor substrate 56 and from the circuit elements formed therein and thereon by dielectric 60 except at selected contact openings 64 formed to expose those elements that are to be interconnected. In the embodiment shown, diffusion barrier 52 is first formed in order to prevent metallurgic reaction between the exposed silicon and subsequently formed metal layers. While diffusion barrier 52 has been illustrated as a layer formed over dielectric 60, it is to be understood that diffusion barrier 52 could be selectively deposited by chemical vapor deposition to fill only contact openings 64, and not to cover dielectric layer 60. Aluminum-silicon alloy 14 is then formed followed by the formation of transition metal layer 16, as described above.

Layers 52, 14 and 16 are then patterned in the same photolithographic etch process. Processing of interconnect member 50 then proceeds in the manner described above in reference to FIGS. 3(b) and 3(c) to produce an interconnect according to the present invention having a transistor metal cladding on top and sides.

The interconnect according to the present invention will find wide applications in integrated circuits of varying sorts. It can be used in memories, processors, and other integrated circuits. Illustratively, within a semiconductor memory, there are numerous circuits such as row address buffers, clock generators, sense amplifiers, data lines, input and output buffers and various decoders. These circuits are interconnected by conductors, frequently metal. An interconnect, according to the present invention, can be used for such connections. Numerous uses will become apparent to the art.

It will be evident to those skilled in the art that many alterations and modifications may be made to the described method without departing from the invention. By way of example only, the sequence in which some of the steps are practiced may be altered to suit a particular application or processing environment. Many other such changes will be obvious to those skilled in the art. Accordingly, it is intended that all such modifications and alternations be considered as within the spirit and scope of the invention as defined by the appended claims.

What is claimed is:

1. An interconnect for an integrated circuit having a substrate, comprising:
   an interconnect member formed of an aluminum-based metal established on the substrate and patterned into a desired interconnection pattern having a top surface and side surfaces, said interconnect member comprising a composite structure of alternating layers of titanium and layers of aluminum alloys, said alternating layers of titanium and aluminum alloys beginning with a lower layer of said aluminum alloy and including at least two layers of aluminum alloy alternating with at least two layers of titanium; and
   a conformal layer of a transition metal established over the patterned interconnect member to cover the top and sides of the patterned interconnect member such that the transition metal covering prevents the formation of vertical hillocks and lateral protrusions.

2. The interconnect as in claim 1 wherein said interconnect member comprises a homogeneous alloy of aluminum-silicon in which the silicon concentration is between 0.5 and 2.0 weight percent.

3. The interconnect as in claim 1 wherein said interconnect member comprises a homogeneous alloy of aluminum-silicon-titanium in which the silicon concentration is between 0.5 to 2.0 weight percent and the titanium concentration is between 0.1 and 0.5 weight percent.

4. The interconnect member as in claim 1 further comprising a base located beneath said interconnect member, said base comprising a diffusion barrier layer that is patterned together with said interconnect member.

5. The interconnect member as in claim 4 wherein said diffusion barrier layer comprises titanium nitride.

6. The interconnect as in claim 1 wherein said transition metal on said top surface is the same as said transition metal on said side surfaces of said interconnect member.

7. The interconnect as in claim 6 wherein said transition metal on said top surface and said side surfaces comprises titanium.

8. The interconnect as in claim 1 wherein said transition metal on said top surface is different from said transition metal on said side surfaces of said interconnect member.

9. The interconnect as in claim 8 wherein said transition metal on said top surface comprises titanium and said transition metal on said side surfaces of said interconnect metal comprises tungsten.

10. An interconnect for an integrated circuit having a substrate, comprising:
   an interconnect member formed of an aluminum-based alloy established on the substrate and patterned into a desired interconnection pattern having a top surface and side surfaces;
   a conformal layer of a transition metal established over the layered interconnect member to cover the top and sides of the patterned interconnect member such that the transition metal covering prevents the formation of vertical hillocks and lateral protrusions; and
   a base located beneath said interconnect member, said base comprising a diffusion barrier layer that is patterned together with said interconnect member.

11. The interconnect as in claim 10 wherein said diffusion barrier is titanium nitride.

12. The interconnect as in claim 10 wherein said interconnect member comprises a homogeneous alloy of aluminum-silicon in which the silicon concentration is between 0.5 to 2.0 weight percent.

13. The interconnect as in claim 10 wherein said interconnect member comprises a homogeneous alloy of aluminum-silicon-titanium in which the silicon concentration is between 0.5 to 2.0 weight percent and the titanium concentration is between 0.1 and 0.5 weight percent.

14. The interconnect member in claim 10 wherein said interconnect member comprises a composite structure of alternating layers of titanium and layers of aluminum alloys.

15. The interconnect as in claim 10 wherein said transition metal on top surface is the same as said transition metal on said side surfaces of said interconnect member.

16. The interconnect as in claim 10 wherein said transition metal on said top surface and said side surfaces comprises titanium.

17. The interconnect as in claim 16 wherein said transition metal on said top surface is different from said transition metal on said side surfaces of said interconnect member.

18. The interconnect as in claim 10 wherein said transition metal on said top surface comprises titanium and said transition metal on said side surfaces of said interconnect metal comprises tungsten.

* * * * *